United States Patent
Ganesan et al.

(10) Patent No.: US 11,869,842 B2
(45) Date of Patent: Jan. 9, 2024

(54) SCALABLE HIGH SPEED HIGH BANDWIDTH IO SIGNALING PACKAGE ARCHITECTURE AND METHOD OF MAKING

(71) Applicant: Intel Corporation, Santa Clara, CA (US)

(72) Inventors: Sanka Ganesan, Chandler, AZ (US); Robert L. Sankman, Phoenix, AZ (US); Arghya Sain, Chandler, AZ (US); Sri Chaitra Jyotsna Chavali, Chandler, AZ (US); Lijiang Wang, Chandler, AZ (US); Cemil Geyik, Gilbert, AZ (US)

(73) Assignee: Intel Corporation, Santa Clara, CA (US)

( * ) Notice: Subject to any disclaimer, the term of this patent is extended or adjusted under 35 U.S.C. 154(b) by 1002 days.

(21) Appl. No.: 16/521,435

(22) Filed: Jul. 24, 2019

(65) Prior Publication Data

US 2021/0028116 A1    Jan. 28, 2021

(51) Int. Cl.
*H01L 23/538* (2006.01)
*H01L 23/498* (2006.01)

(52) U.S. Cl.
CPC .... *H01L 23/5381* (2013.01); *H01L 23/49816* (2013.01); *H01L 23/49822* (2013.01); *H01L 23/49838* (2013.01); *H01L 23/5383* (2013.01); *H01L 23/5384* (2013.01); *H01L 23/5386* (2013.01)

(58) Field of Classification Search
CPC ........... H01L 23/5381; H01L 23/49816; H01L 23/49822; H01L 23/49838; H01L 23/5383; H01L 23/5384; H01L 23/5386
USPC ......................................................... 257/668
See application file for complete search history.

(56) References Cited

U.S. PATENT DOCUMENTS

| | | | |
|---|---|---|---|
| 2010/0078826 A1* | 4/2010 | Gurumurthy | H05K 3/222 257/E23.141 |
| 2014/0264791 A1* | 9/2014 | Manusharow | H01L 23/5383 438/107 |
| 2017/0168235 A1* | 6/2017 | Zhang | G02B 6/4257 |
| 2018/0180808 A1* | 6/2018 | Zhang | G02B 6/4274 |
| 2018/0267265 A1* | 9/2018 | Zhang | G02B 6/4261 |
| 2019/0132160 A1* | 5/2019 | Wu | H04L 25/03878 |

* cited by examiner

*Primary Examiner* — Dzung Tran
(74) *Attorney, Agent, or Firm* — Schwabe, Williamson & Wyatt, P.C.

(57) ABSTRACT

Embodiments disclosed herein include electronic packages. In an embodiment, an electronic package comprises a package substrate, wherein the package substrate comprises a first routing architecture. In an embodiment, the electronic package further comprises a first die on the package substrate, a second die on the package substrate, wherein the first die is electrically coupled to the second die by a bridge embedded in the package substrate, and a routing patch on the package substrate. In an embodiment, the routing patch is electrically coupled to the second die, and wherein the routing patch comprises a second routing architecture that is different than the first routing architecture.

17 Claims, 11 Drawing Sheets

SCALABLE HIGH SPEED HIGH BANDWIDTH IO SIGNALING PACKAGE ARCHITECTURE AND METHOD OF MAKING

TECHNICAL FIELD

Embodiments of the present disclosure relate to semiconductor devices, and more particularly to electronic packages that comprise a high speed high bandwidth routing patch for routing signals from a serializer/deserializer (SERDES).

BACKGROUND

For data centric businesses, a key server architecture requirement is to provide highly scalable network bandwidth as a function of time. Serializer/deserializer (SERDES) dies provide the off-package (network) bandwidth. SERDES architecture roadmaps are trending towards increased speed and number of lanes to provide an increased off-package I/O bandwidth over time. For example, speed trends are targeting 28 Gb/s, 56 Gb/s, 112 Gb/s, 224 Gb/s, and beyond, and the number of lanes are expected to increase to 4, 8, 16, and beyond. This translates to server packages needing to house multiple SERDES dies along with the processors as part of a heterogeneous integration. In-package bandwidth of the processor-SERDES interconnects are provided by embedded bridges, silicon interposers, or high density organic package routing. Signals out of the SERDES die (which are very high speed signals, and include multiple lanes) are currently routed through the package substrate to the printed circuit board (PCB) to provide the required off-package network bandwidth. Key parameters for the package routing is to be very low loss (both transmission loss and cross-talk) while meeting the impedance requirement for differential signaling.

Designing the package substrate in view of the off-package network bandwidth requirements is not without issue. In order to meet these target parameters, packages may be formed with low loss dielectrics that have greater dielectric thicknesses between metal layers. One technique for increasing dielectric thicknesses is the use of so called "skip layers". However, the use of a skip layer architecture results in copper density uniformity issues. Additionally, the copper traces may be formed with a lower surface roughness in order to reduce the skin effect. However, smoother surfaces for the copper traces reduces adhesion. Furthermore, in order to accommodate the growing number of lanes and increased speeds, the packages must increase in size. Larger packages with 16 or more layers may be necessary in order to meet targeted metrics. This results in increases to costs and form factor.

EMBODIMENTS OF THE PRESENT DISCLOSURE

Figure 1A:
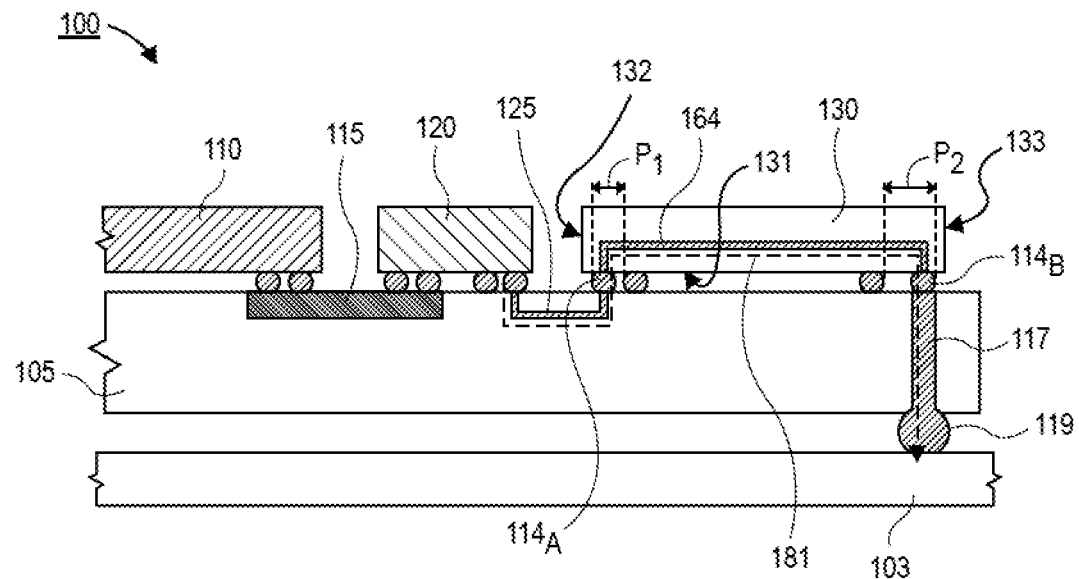
FIG. 1A is a cross-sectional illustration of an electronic package with a routing patch that electrically couples a SERDES die to a printed circuit board (PCB), in accordance with an embodiment.

Described herein are electronic packages that comprise a high speed high bandwidth routing patch for routing signals from a serializer/deserializer (SERDES), in accordance with various embodiments. In the following description, various aspects of the illustrative implementations will be described using terms commonly employed by those skilled in the art to convey the substance of their work to others skilled in the art. However, it will be apparent to those skilled in the art that the present invention may be practiced with only some of the described aspects. For purposes of explanation, specific numbers, materials and configurations are set forth in order to provide a thorough understanding of the illustrative implementations. However, it will be apparent to one skilled in the art that the present invention may be practiced without the specific details. In other instances, well-known features are omitted or simplified in order not to obscure the illustrative implementations.

Various operations will be described as multiple discrete operations, in turn, in a manner that is most helpful in understanding the present invention, however, the order of description should not be construed to imply that these operations are necessarily order dependent. In particular, these operations need not be performed in the order of presentation.

As noted above, off-package (network) I/O bandwidth demands are rapidly increasing. In order to accommodate such increases in network I/O bandwidth, the package substrates on which processors and SERDES die are mounted are growing and becoming more complex. Accordingly, embodiments disclosed herein include electronic packages where the SERDES routing is removed from the package substrate. The SERDES routing may instead be implemented with a routing patch that is attached over the package substrate. Removing the SERDES routing from the package substrate simplifies the manufacturing of the package substrate (e.g., fewer layers are needed, standard dielectric thicknesses may be used, copper densities are more uniform, etc.).

Additionally, the routing patch may be optimized for low loss transmission of high speed, high bandwidth I/O signaling. For example, low loss dielectrics may be used, and the dielectric thicknesses may be increased without needing to use skip layers or the like. Furthermore, the routing patch provides for modular configuration of the electronic package. For example, if network I/O bandwidth requirements change in the future, the routing patch may be removed and replaced without needing to replace the entire package substrate.

In one embodiment, the routing patch provides pitch translation from a first pitch to a second larger pitch for a plurality of interconnect lines. After the pitch of interconnect lines is increased, the interconnect lines may be coupled to an external device (e.g., a PCB or the like). In some embodiments, a via through the package substrate may couple the interconnect lines to a PCB. Despite passing back through the package substrate, the losses are able to be minimized since the routing through the package substrate is a substantially vertical path with little (if any) horizontal routing component. In other embodiments, the routing patch may include connectors that are configured to receive cables. The cables may be connected to the PCB. That is, the conductive path of the off package routing may not pass through the package substrate after reaching the routing patch.

Referring now to FIG. 1A, a cross-sectional illustration of an electronic package 100 is shown, in accordance with an embodiment. In an embodiment, the electronic package 100 may comprise a package substrate 105. The package substrate 105 may comprise any number of dielectric layers and metal layers (e.g., to provide conductive routing within the package substrate 105). The individual dielectric layers and metal layers are omitted in order to not obscure embodiments disclosed herein.

In an embodiment, a first die 110 and a second die 120 are attached to a top surface of the package substrate 105. The first die 110 may be electrically coupled to the second die 120. For example, the first die 110 may be electrically coupled to the second die 120 with any suitable high density interconnect. For example, the first die 110 may be electrically coupled to the second die 120 by an embedded multi-die interconnect bridge (EMIB) 115 or the like. The first die 110 may comprise a processor die. For example, the first die 110 may be a field-programmable gate array (FPGA) processor, or any other type of processor. In an embodiment, the second die 120 may be a serializer/deserializer (SERDES) die 120.

In an embodiment, a signal path 181 extends between the SERDES die 120 and a board 103 on which the package substrate 105 is supported. In an embodiment, the signal path 181 includes portions that pass through the package substrate 105 (e.g., trace 125 and via 117) and portions that pass through a routing patch 130 (e.g., trace 164). In an embodiment, a length of the portion of the signal path 181 passing through the routing patch 130 may be longer than a length of the portion of the signal path 181 passing through the package substrate 105. In an embodiment, the routing patch 130 is optimized for transmission of high speed I/O signals. As such, the losses along the signal path 181 are minimized because the majority of the signal path 181 is along the low loss routing patch 130 that is external to the package substrate 105.

In an embodiment, the routing patch 130 may comprise metal layers and dielectric layers that provide electrical routing from a first end 132 of the routing patch 130 to a second end 133 of the routing patch 130. An exemplary trace 164 that extends through the routing patch 130 is shown in FIG. 1A. In an embodiment, the trace 164 has a first end that is coupled to a bump $114_A$ and a second end that is coupled to a bump $114_B$. In an embodiment, the bumps $114_A$ and $114_B$ may attach to a bottom surface 131 of the routing patch 130 proximate to the first end 132 and a second end 133 of the routing patch 130, respectively. The traces 164 through the routing patch 130 may provide pitch translation. For example, the bumps $114_A$ proximate to the first end 132 of the routing patch 130 may have a first pitch $P_1$, and the bumps $114_B$ proximate to the second end 133 of the routing patch 130 may have a second pitch $P_2$ that is greater than the first pitch $P_1$. In an embodiment, the first pitch $P_1$ may be substantially the same as the bump pitch of the first die 110 and the second die 120 (e.g., first level interconnect (FLI) bumps), and the second pitch $P_2$ may be substantially equal to the pitch of bumps 119 (e.g., second level interconnects (SLI) or midlevel interconnects (MLI)).

Figure 1B:
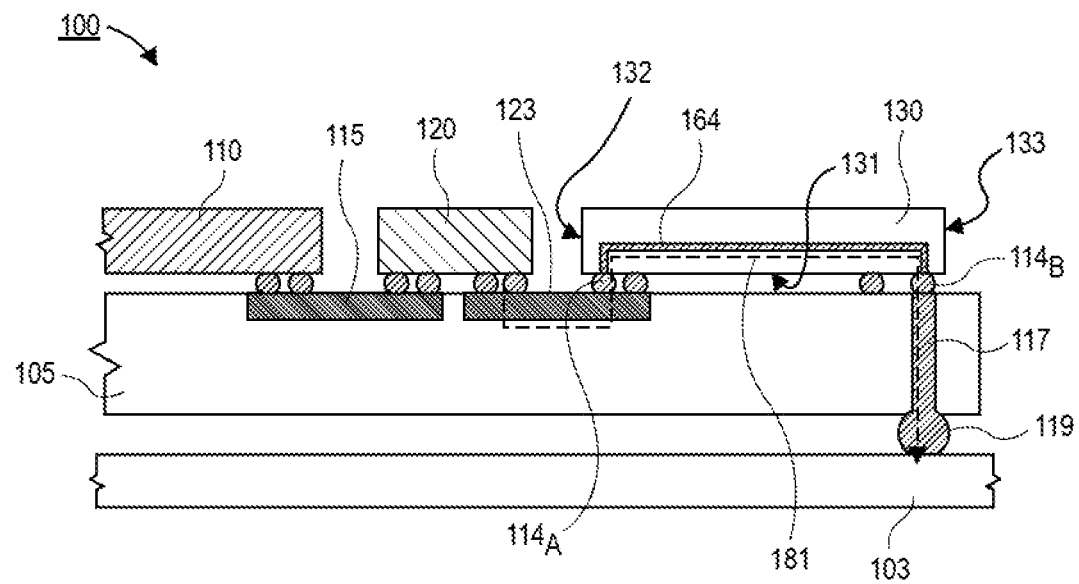
FIG. 1B is a cross-sectional illustration of an electronic package with a routing patch that is electrically coupled to a SERDES die by a bridge, in accordance with an embodiment.

In an embodiment, the routing patch 130 may be electrically coupled to the second die 120. For example, the second die 120 may be electrically coupled to the routing patch 130 by one or more traces 125 embedded in the package substrate 105 or over the package substrate 105. In an embodiment, the length of the trace 125 is minimized in order to decrease the losses along the signal path 181. For example, a length of the trace 125 in the package substrate 105 is smaller than a length of the trace 164 in the routing patch 130. In other embodiments, the routing patch 130 may be electrically coupled to the second die 120 with an embedded bridge 123 (e.g., an EMIB or the like), as is shown in FIG. 1B. The use of a bridge 123 may reduce losses along the signal path 181 compared to a trace 125 through the package substrate 105.

In an embodiment, the bumps $114_B$ at the second end of the trace 164 may be electrically coupled to a backside surface of the package substrate 105. For example, the bumps $114_B$ may be coupled to a via 117 that passes through the package substrate 105 and lands on a bump 119. The via 117 may be substantially vertical in order to minimize the length through the package substrate 105. While illustrated as a single via that extends all the way through the package substrate 105, it is to be appreciated that the via 117 may comprise a plurality of vias and pads vertically stacked over each other in an alternating pattern. The bump 119 is electrically coupled to the board 103.

In an embodiment, the routing patch 130 is tailored to provide low loss transmission for high speed I/O signals to/from the SERDES die 120. That is, a routing architecture of the routing patch 130 may be different than a routing architecture of the package substrate 105. As used herein, "routing architecture" may refer to one or more different aspects of a substrate that includes traces for signal routing. For example, routing architecture may refer to one or more of dielectric constant (Dk), dielectric thickness, trace dimensions, and the like. Routing architecture may also refer to whether the traces are used in strip line routing, microstrip routing, and variants thereof.

In one embodiment, the routing patch 130 may comprise a first dielectric material and the package substrate 105 may comprise a second dielectric material that is different than the first dielectric material. Particularly, the first dielectric material may have a lower dielectric constant than the second dielectric material. Accordingly, lower loss transmission of high speed I/O signals is provided through the routing patch 130, compared to the package substrate 105. In a particular embodiment, the routing patch 130 may comprise a dielectric material with a dielectric constant that is less than 4, less than 2, or less than 1.

In an additional embodiment, dielectric thicknesses between metal layers may also differ between the package substrate 105 and the routing patch 130. For example, typical dielectric thickness of a dielectric layer in the package substrate 105 may be less than approximately 50 µm, whereas the dielectric thicknesses of a dielectric layer in the routing patch 130 may be greater than approximately 50 µm. In a particular embodiment, a thickness of the dielectric layers in the routing patch 130 may be between approximately 70 µm and 100 µm. The combination of lower dielectric constant material and thicker dielectric layers between metal layers allows for traces to be made wider while still maintaining the impedance matching needed for differential signaling.

The routing patch 130 may be fabricated with any suitable substrate architecture that allows for low loss dielectrics. For example, the routing patch 130 may be a molded interconnect substrate ball grid array (MISBGA) substrate. MISBGA systems are suitable for use with low loss dielectrics (e.g., dielectric constants (Dk) less than 4). Furthermore, since MISBGA systems include lithographic via formation and planarization, large dielectric thicknesses (e.g., greater than 50 µm) are possible. In other embodiments, the routing patch 130 may be assembled using flexible-PCB systems. Such substrates enable the use of low-loss liquid crystal polymers as the dielectric material. In yet another embodiment, the routing patch 130 may be formed with organic interposer technology.

Figure 1C:
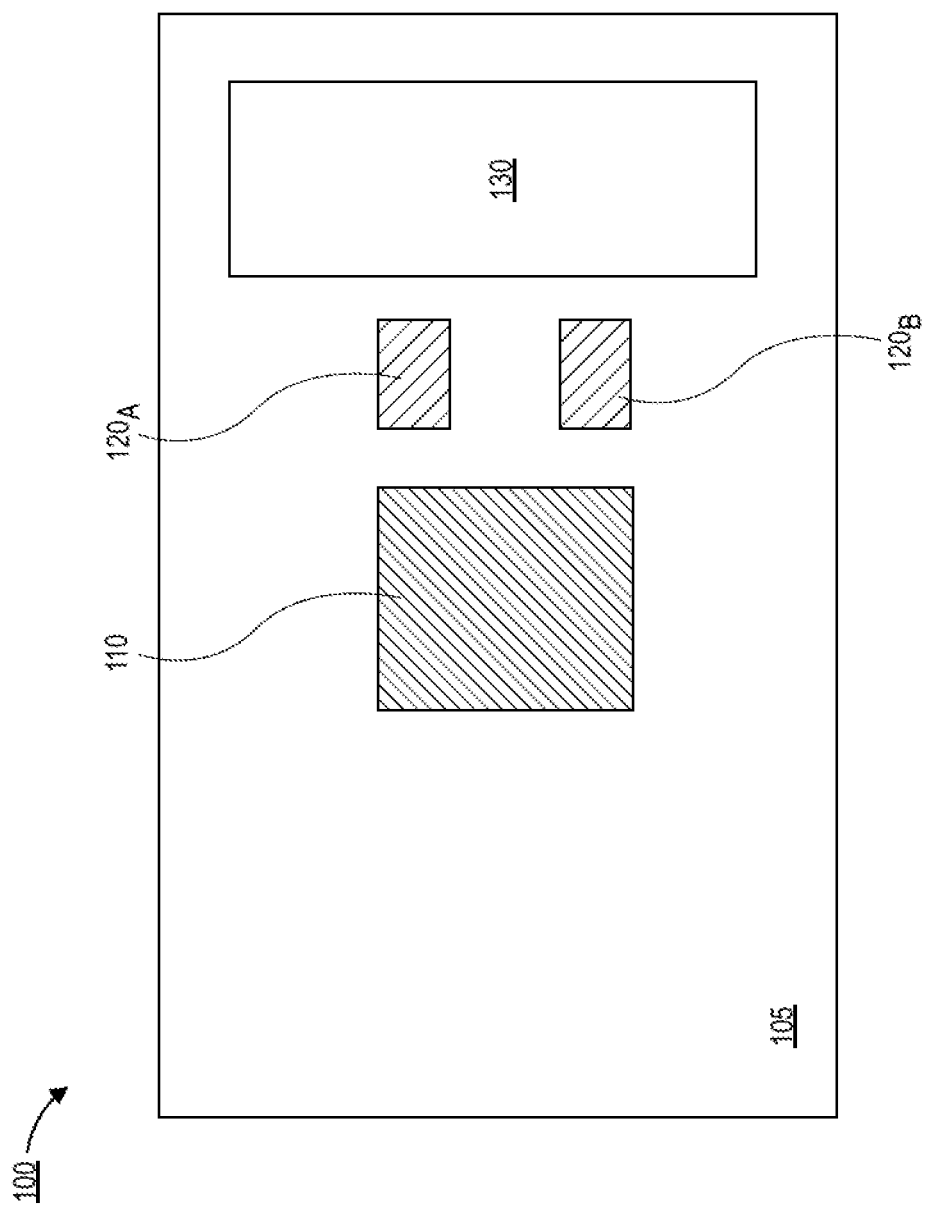
FIG. 1C is a plan view illustration of an electronic package with a routing patch that electrically couples a SERDES die to a PCB, in accordance with an embodiment.

Referring now to FIG. 1C, a plan view illustration of an electronic package 100 is shown, in accordance with an embodiment. In an embodiment, the electronic package 100 comprises a first die 110 and a plurality of second dies 120. For example a pair of second dies $120_A$ and $120_B$ are shown in FIG. 1C. However, it is to be appreciated that there may be any number of second dies 120. For example, additional SERDES dies 120 allow for an increase in the number of lanes available for high speed signaling. In an embodiment, the routing patch 130 may be electrically coupled to the second dies 120. The routing patch 130 may be substantially similar to the routing patch 130 described above with respect to FIG. 1A.

Figure 1D:
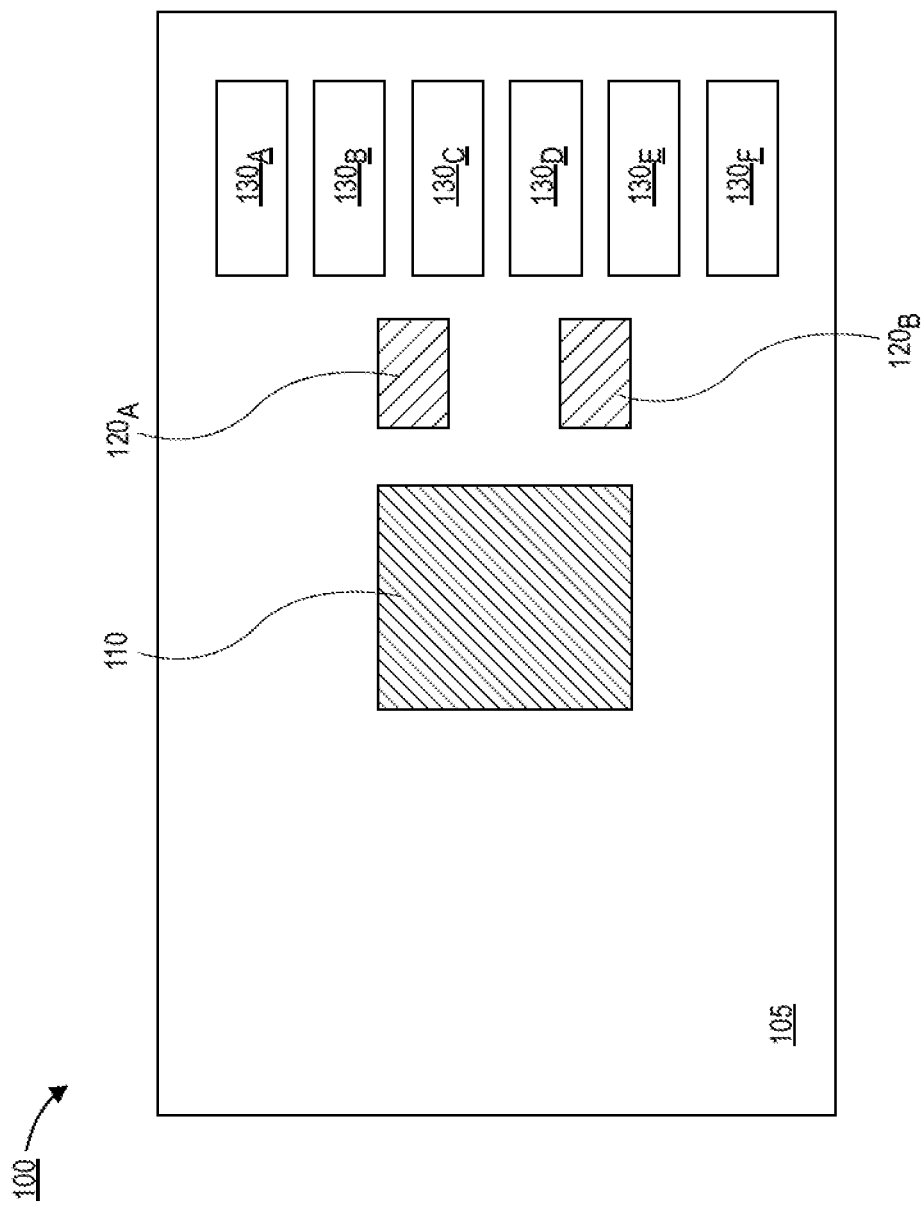
FIG. 1D is a plan view illustration of an electronic package with a plurality of routing patches, in accordance with an embodiment.

Referring now to FIG. 1D, a plan view illustration of an electronic package 100 is shown, in accordance with an additional embodiment. The electronic package 100 in FIG. 1D may be substantially similar to the electronic package in FIG. 1C, with the exception that a plurality of routing patches $130_{A-F}$ are disposed over the surface of the package substrate 105. While six routing patches $130_{A-F}$ are shown in FIG. 1D, it is to be appreciated that any number of routing patches 130 may be included in the electronic package 100. Furthermore, since the routing patches $130_{A-F}$ are mounted to a top surface of the package substrate 105, it is easy to replace one or more of the routing patches 130 (e.g., to upgrade to newer versions) or to add additional routing patches 130 to accommodate additional lanes. As such, the electronic package 100 provides greater flexibility with respect to system upgrades compared to systems where the routing path is entirely within the package substrate 105.

In FIGS. 1A-1D, the signal path 181 is primarily formed through the routing patch 130 and a vertical via through the package substrate 105. However, embodiments disclosed herein may also include a signal path that bypasses the vertical path through the package substrate. Instead, connectors may be attached to the routing patch. The connectors may interface with cables that provide a direct link to the board or other device where the signals are to be routed.

Figure 2A:
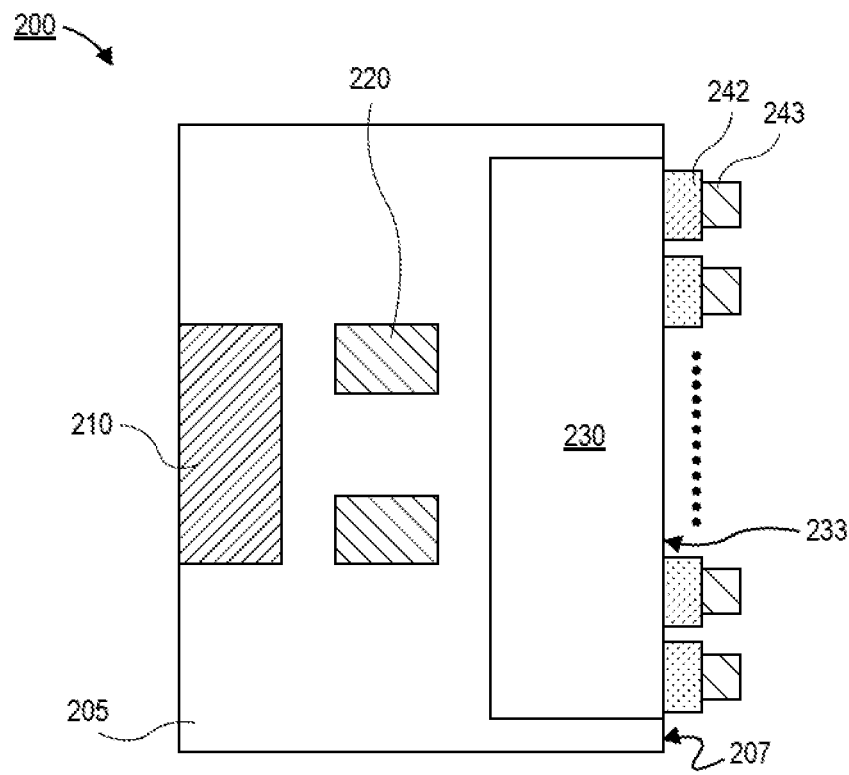
FIG. 2A is a plan view illustration of an electronic package with a routing patch with connectors that are attached to a side of the routing patch, in accordance with an embodiment.
Figure 2B:
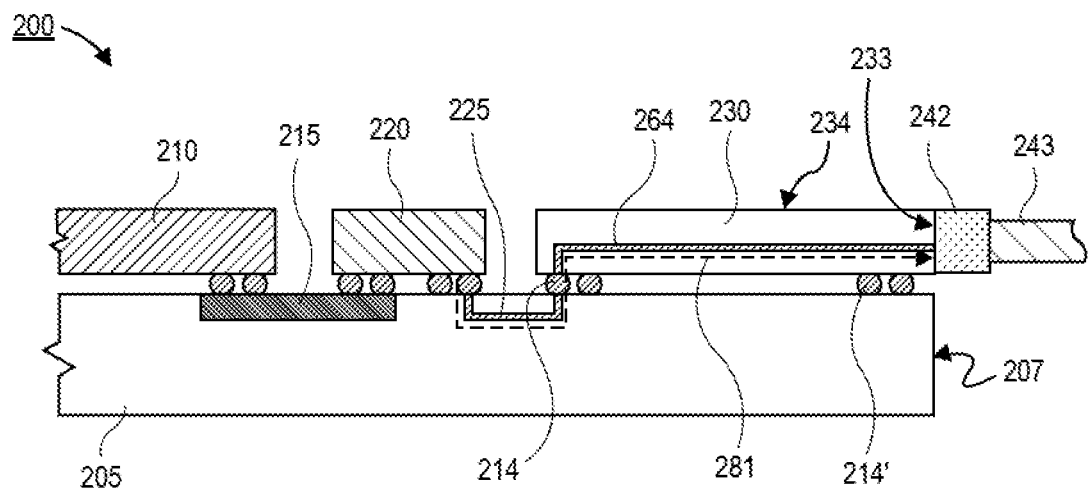
FIG. 2B is a cross-sectional illustration of the electronic package in FIG. 2A, in accordance with an embodiment.

Referring now to FIGS. 2A and 2B, a plan view illustration and a cross-sectional illustration of an electronic package 200 are shown, respectively, in accordance with an embodiment. In an embodiment, the electronic package 200 comprises a first die 210 and a second die 220 that are attached to a package substrate 205. The first die 210 may be electrically coupled to the second die 220 by a bridge 215 or the like. In an embodiment, the package substrate 205, the first die 210, the bridge 215, and the second die 220 may be substantially similar to those described above with respect to FIGS. 1A-1D.

In an embodiment, a signal path 281 from the second die 220 to an external component (e.g., a board or the like) is provided. The signal path 281 may pass over a routing patch 230 that is electrically coupled to the second die 220. For example, the signal path 281 may include a trace 225 that electrically couples the second die 220 to the routing patch 230. In an embodiment, the routing patch 230 may comprise a plurality of traces 264 that provide routing along the signal path 281. In an embodiment a first end of the trace 264 terminates at a bump 214, and a second end of the trace 264 terminates at a connector 242. In an embodiment, the connector 242 is an edge connector that is attached to an end 233 of the routing patch 230.

Each connector 242 may interface with a cable 243 that is suitable for propagating the signal. In an embodiment, the cable 243 is a dielectric waveguide, a coaxial cable, or any other suitable cable. In some embodiments, the cable 243 is an optical cable (e.g., fiber optic cable). In such embodiments, the connector 242 may include an electrical-to-optical converter to convert optical signals to electrical signals and vice-versa. In an embodiment, the routing patch 230 may include dummy bumps 214' that provide mechanical coupling to the package substrate 205. That is, dummy bumps 214' may provide only mechanical support and no signals pass through the dummy bumps 214'.

In an embodiment, the routing patch 230 may extend out to an edge 207 of the package substrate 205. As shown, the routing patch 230 has an outer edge 233 that is substantially coplanar with the outer edge 207 of the package substrate 205. However, it is to be appreciated that the outer edge 233 of the routing patch 230 may also be set back from the edge 207 of the package substrate 205. In an embodiment, the routing patch 230 may be entirely within a footprint of the package substrate 205.

Figure 2C:
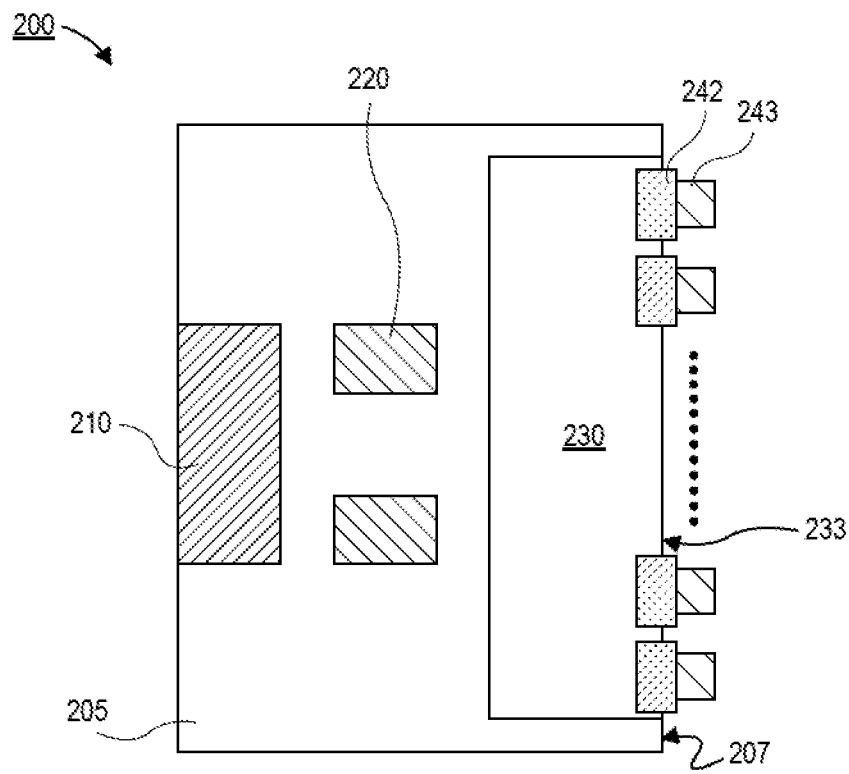
FIG. 2C is a plan view illustration of an electronic package with a routing patch with connectors that are attached to a top surface of the routing patch, in accordance with an embodiment.
Figure 2D:
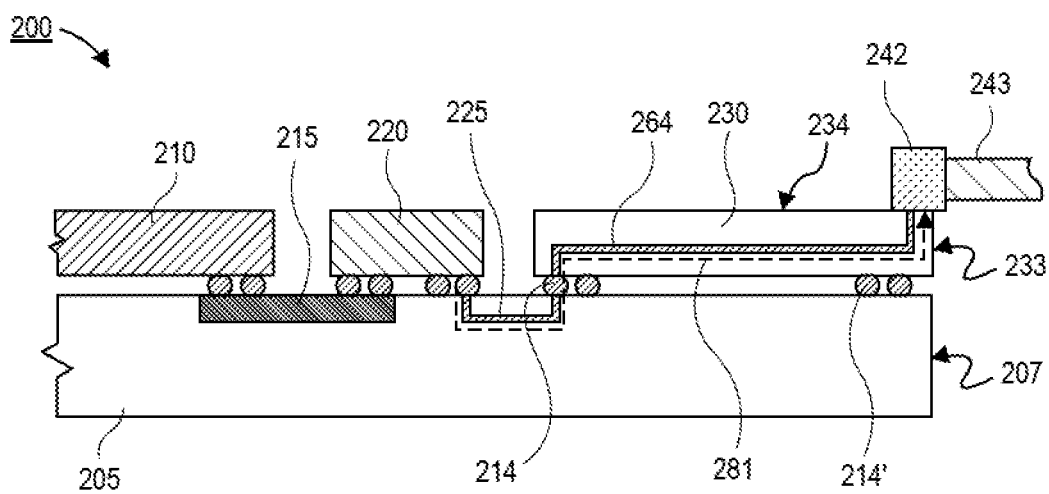
FIG. 2D is a cross-sectional illustration of the electronic package in FIG. 2C, in accordance with an embodiment.

Referring now to FIGS. 2C and 2D, a plan view illustration and a cross-sectional illustration of an electronic package 200 are shown, respectively, in accordance with an embodiment. In an embodiment, the electronic package 200 in FIGS. 2C and 2D is substantially similar to the electronic package 200 shown in FIGS. 2A and 2B, with the exception that the connectors 242 are located over a different surface of the routing patch 230. Particularly, the connectors 242 are disposed over a top surface 234 of the routing patch 230.

Figure 2E:
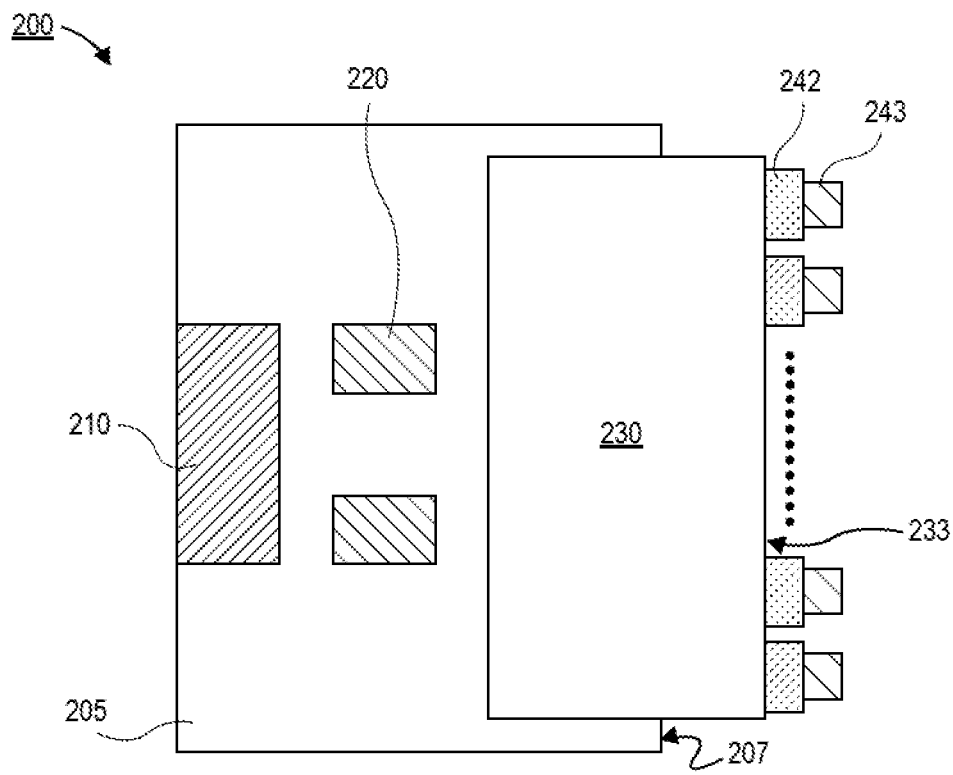
FIG. 2E is a plan view illustration of an electronic package with a routing patch that extends past an edge of the electronic package with connectors that are attached to a side of the routing patch, in accordance with an embodiment.
Figure 2F:
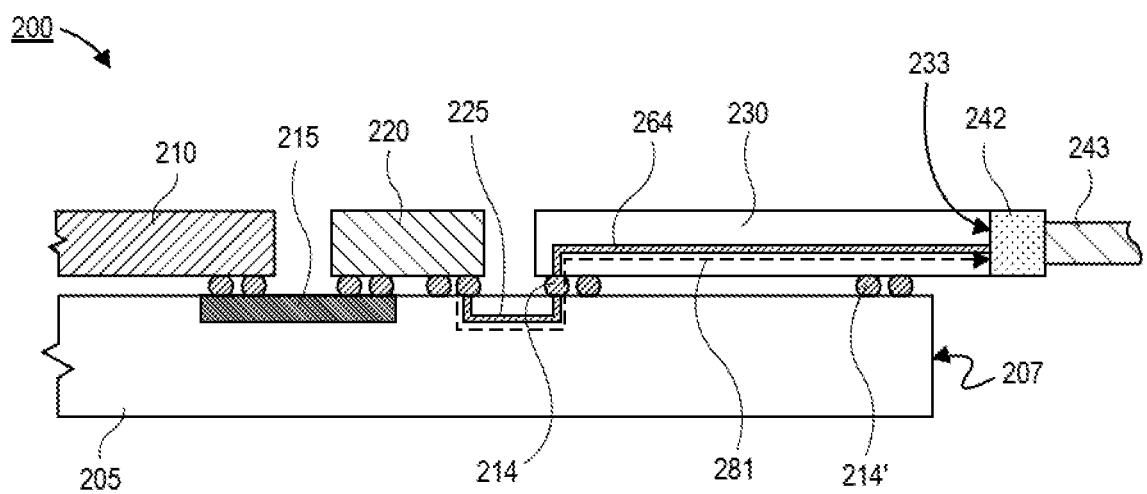
FIG. 2F is a cross-sectional illustration of the electronic package in FIG. 2E, in accordance with an embodiment.

Referring now to FIGS. 2E and 2F, a plan view illustration and a cross-sectional illustration of an electronic package 200 are shown, respectively, in accordance with an embodiment. In an embodiment, the electronic package 200 in FIGS. 2E and 2F is substantially similar to the electronic package 200 in FIGS. 2A and 2B, with the exception that the routing patch 230 extends beyond an edge 207 of the package substrate 205. As shown, the end 233 of the routing patch 230 is cantilevered out beyond the edge 207. Extending the routing patch 230 beyond the edge 207 of the package substrate 205 provides a platform that is outside of the package heat sink footprint. This additional platform may function as a dongle, and additional components (not shown) may be mounted on the platform. For example, photonics components may be mounted to the external platform to enable photonics connections to server racks, or the like.

Figure 2G:
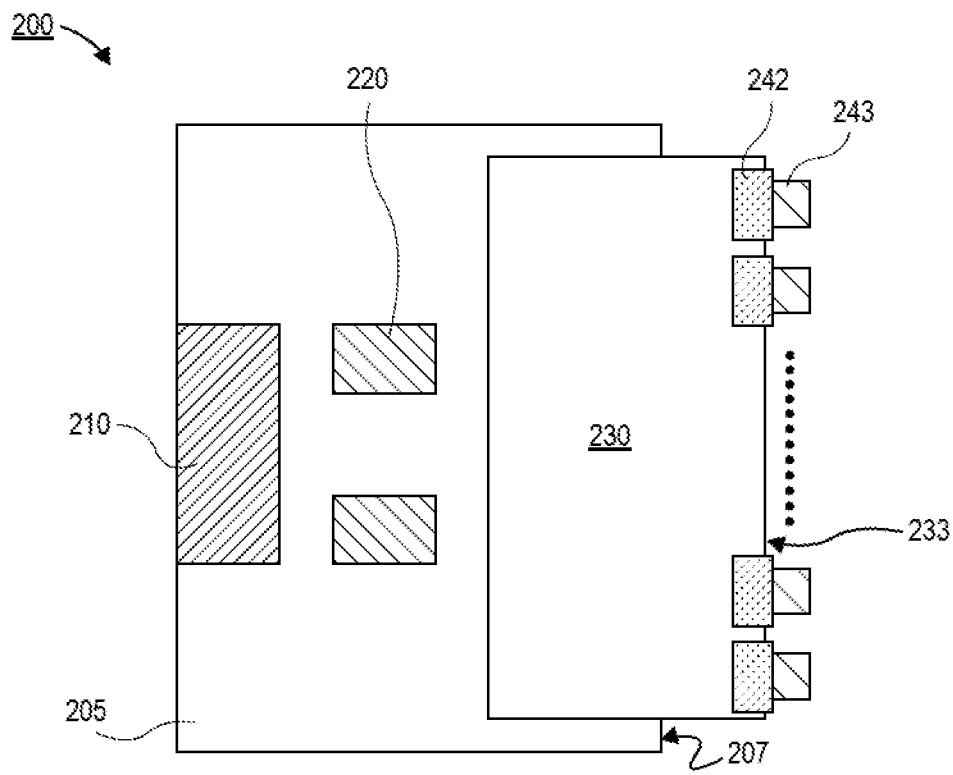
FIG. 2G is a plan view illustration of an electronic package with a routing patch that extends past an edge of the electronic package with connectors that are attached to a top surface of the routing patch, in accordance with an embodiment.
Figure 2H:
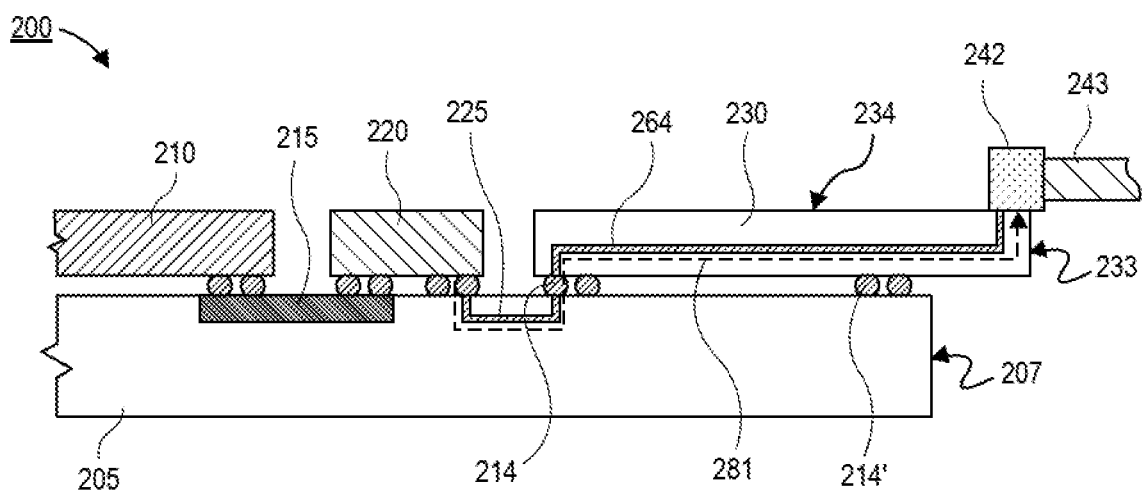
FIG. 2H is a cross-sectional illustration of the electronic package in FIG. 2G, in accordance with an embodiment.

Referring now to FIGS. 2G and 2H, a plan view illustration and a cross-sectional illustration of an electronic package 200 are shown, respectively, in accordance with an embodiment. In an embodiment, the electronic package 200 in FIGS. 2G and 2H are substantially similar to the electronic package 200 shown in FIGS. 2E and 2F, with the exception that the connectors 242 are located over a different surface of the routing patch 230. Particularly, the connectors 242 are disposed over a top surface 234 of the routing patch 230.

Referring now to FIGS. 3A-3D, a series of cross-sectional illustrations that depict various routing architectures that may be implemented in the routing patch are shown, in accordance with an embodiment.

Figure 3A:
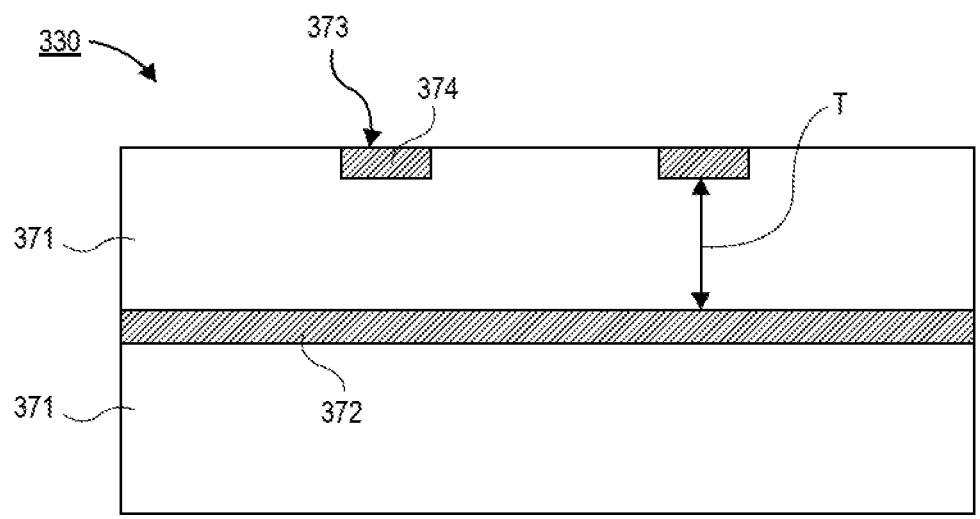
FIG. 3A is a cross-sectional illustration of a portion of a routing patch that illustrates an embedded microstrip routing configuration, in accordance with an embodiment.

Referring now to FIG. 3A, a cross-sectional illustration of a routing patch 330 is shown, in accordance with an embodiment. The routing patch 330 may comprise dielectric layers 371. In an embodiment, a first metal layer 372 may be disposed between the dielectric layers 371. The first metal layer 372 may be a ground plane, or the like. In an embodiment, traces 374 may be partially embedded in one of the dielectric layers 371 to provide a microstrip routing configuration. In FIG. 3A, the traces 374 are embedded with a top surface 373 exposed to air, which is an ultra-low loss dielectric material. In an embodiment, a thickness T of the dielectric layer 371 between the traces 374 and the metal layer 372 may be greater than 50 µm. In a particular embodiment, the thickness T may be between 70 µm and 100 µm.

Figure 3B:
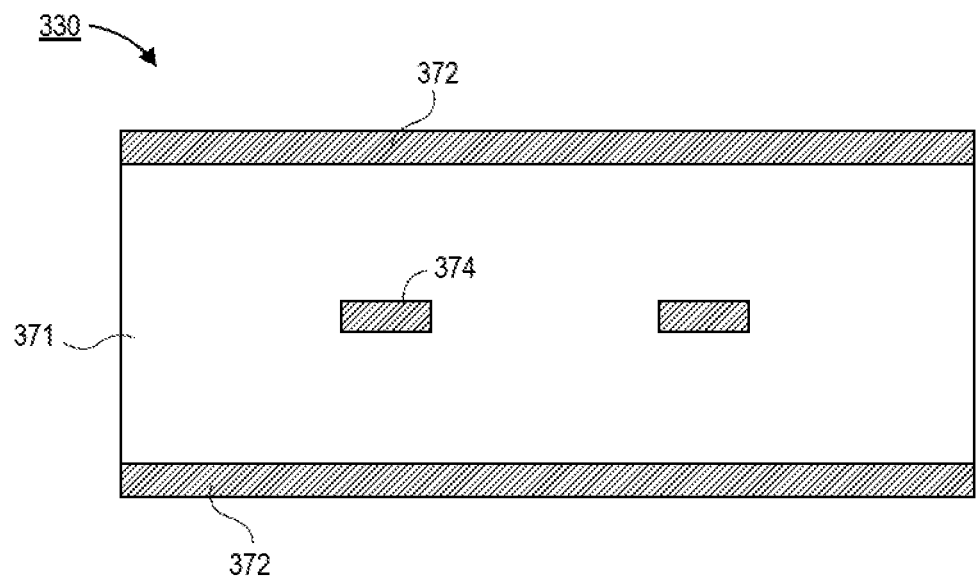
FIG. 3B is a cross-sectional illustration of a portion of a routing patch that illustrates a stripline routing configuration, in accordance with an embodiment.

Referring now to FIG. 3B, a cross-sectional illustration of a routing patch 330 is shown, in accordance with an additional embodiment. In an embodiment, the routing patch 330 may comprise a strip line routing configuration. As shown, a pair of metal layers 372 (e.g., ground planes) may be formed above and below the traces 374 that are fully embedded in the dielectric layer 371. The use of a strip line routing configuration may minimize cross-talk and other electromagnetic interference issues may be mitigated.

Figure 3C:
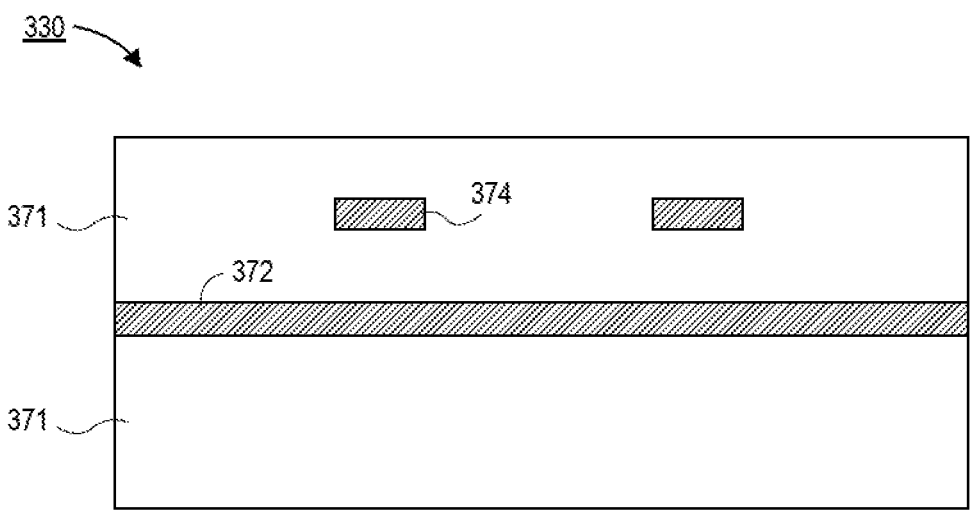
FIG. 3C is a cross-sectional illustration of a portion of a routing patch that illustrates a buried microstrip routing configuration, in accordance with an embodiment.

Referring now to FIG. 3C, a cross-sectional illustration of a routing patch 330 is shown, in accordance with an additional embodiment. In an embodiment, the routing patch 330 may comprise a buried microstrip routing configuration. That is, the signal traces 374 may be entirely embedded within the dielectric material 371. Such a configuration may be implemented using various substrate manufacturing technologies, such as MISBGA architectures.

Figure 3D:
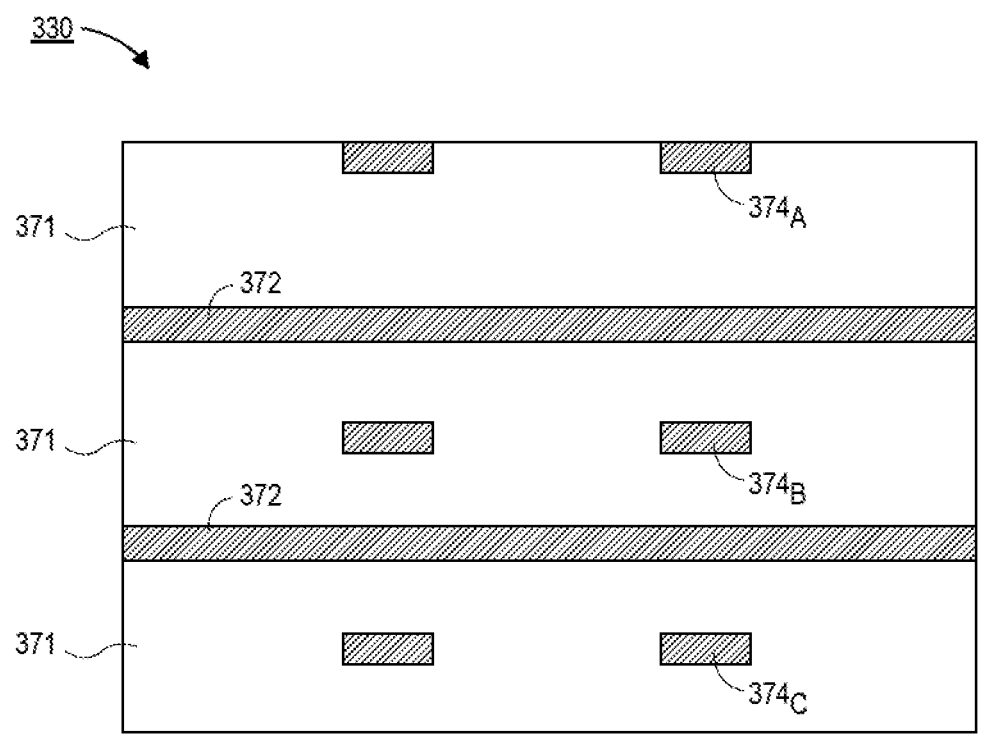
FIG. 3D is a cross-sectional illustration of a portion of a routing patch that illustrates a plurality of different routing configurations within a single substrate, in accordance with an embodiment.

Referring now to FIG. 3D, a cross-sectional illustration of a routing patch 330 is shown, in accordance with an additional embodiment. In an embodiment, the routing patch 330 may include a plurality of different routing configurations. For example, the routing patch 330 may comprise traces $374_A$ with an embedded microstrip configuration, traces $374_B$ with a strip line configuration, and/or traces $374_C$ with a buried microstrip configuration. While three different routing configurations are shown in FIG. 3D, it is to be appreciated that embodiments may include any number of different routing configurations and/or any combination of routing configurations.

Figure 4:
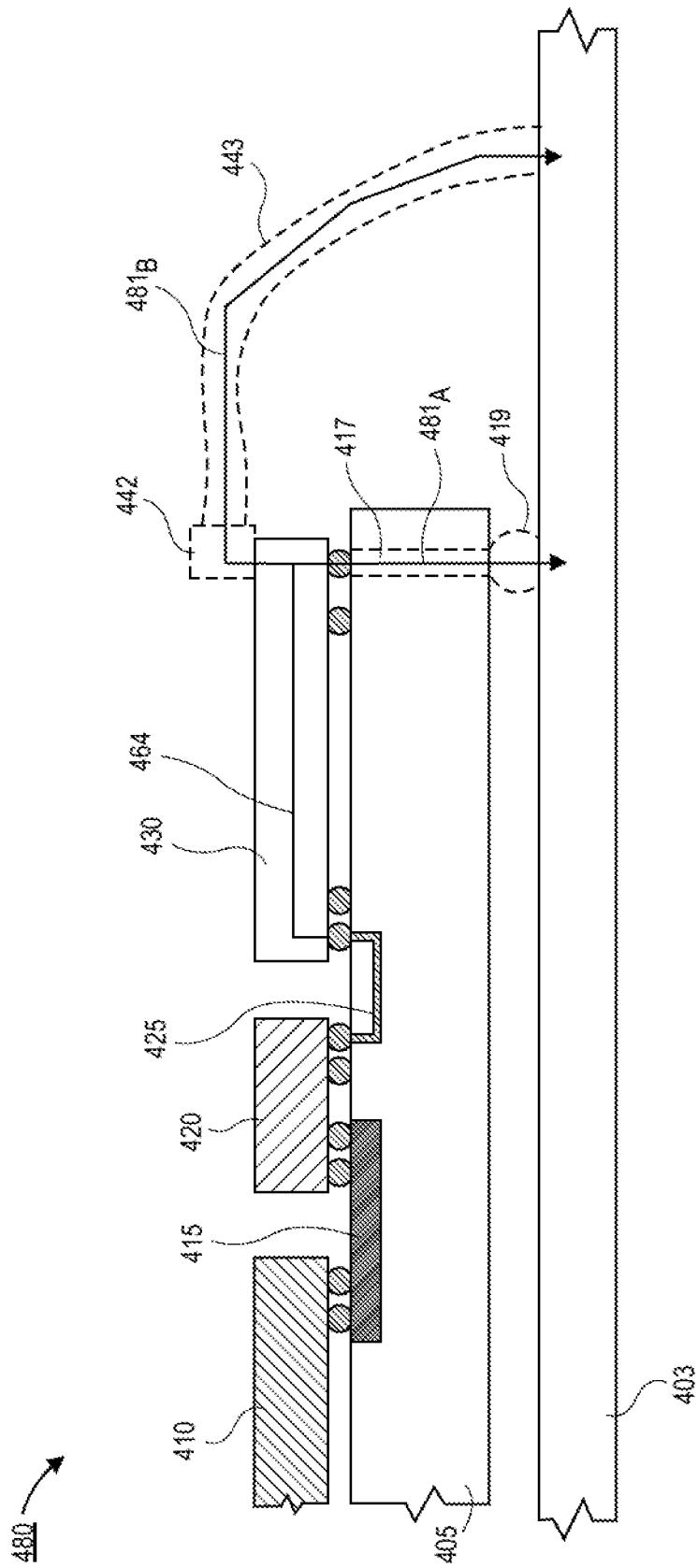
FIG. 4 is a cross-sectional illustration of an electronic system that shows different signal paths that pass through a routing patch that is between a SERDES die and a PCB, in accordance with an embodiment.

Referring now to FIG. 4, an electronic system 480 that illustrates different signal paths $481_A$ and $481_B$ that may be implemented is shown, in accordance with an embodiment. The electronic system 480 may comprise a package substrate 405 that is attached to a board 403. In an embodiment, the board 403 may be a printed circuit board (PCB) or the like. In an embodiment, the electronic system 480 may be a component of a server or a high performance computing (HPC) system. In an embodiment, a first die 410, and a second die 420 may be attached to the package substrate 405. The first die 410 may be electrically coupled to the second die 420 by a bridge 415 or the like. In an embodiment, the second die 420 may be a SERDES die. In an embodiment the SERDES routing may be implemented along either the first signal path $481_A$ or the second signal path $481_B$. While both a first signal path $481_A$ and a second signal path $481_B$ are shown, it is to be appreciated that embodiments may include either the first signal path $481_A$ or the second signal path $481_B$.

In an embodiment, the first signal path $481_A$ and the second signal path 481E may both extend along a trace 464 that is embedded in a routing patch 430. The trace 464 may be one trace of a plurality of traces that provide electrical routing such as pitch translation. For example, first ends of the traces 464 may be connected to pads with a first pitch and second ends of the trace 464 may be connected to pads with a second pitch that is greater than the first pitch. The routing patch 430 may be connected to the second die 420 by a trace 425 or the like.

In an embodiment, the first signal path $481_A$ may extend down into the package substrate 405. Particularly, the first signal path $481_A$ may pass over a via 417 and through a bump 419 that is connected to the board 403. In an embodiment, the second signal path $481_B$ may be extend to a connector 442 and along a cable 443. The cable 443 may be electrically coupled to the board 403. Accordingly, the second signal path $481_B$ may not need to pass back through the package substrate 405 and losses are reduced.

Figure 5:
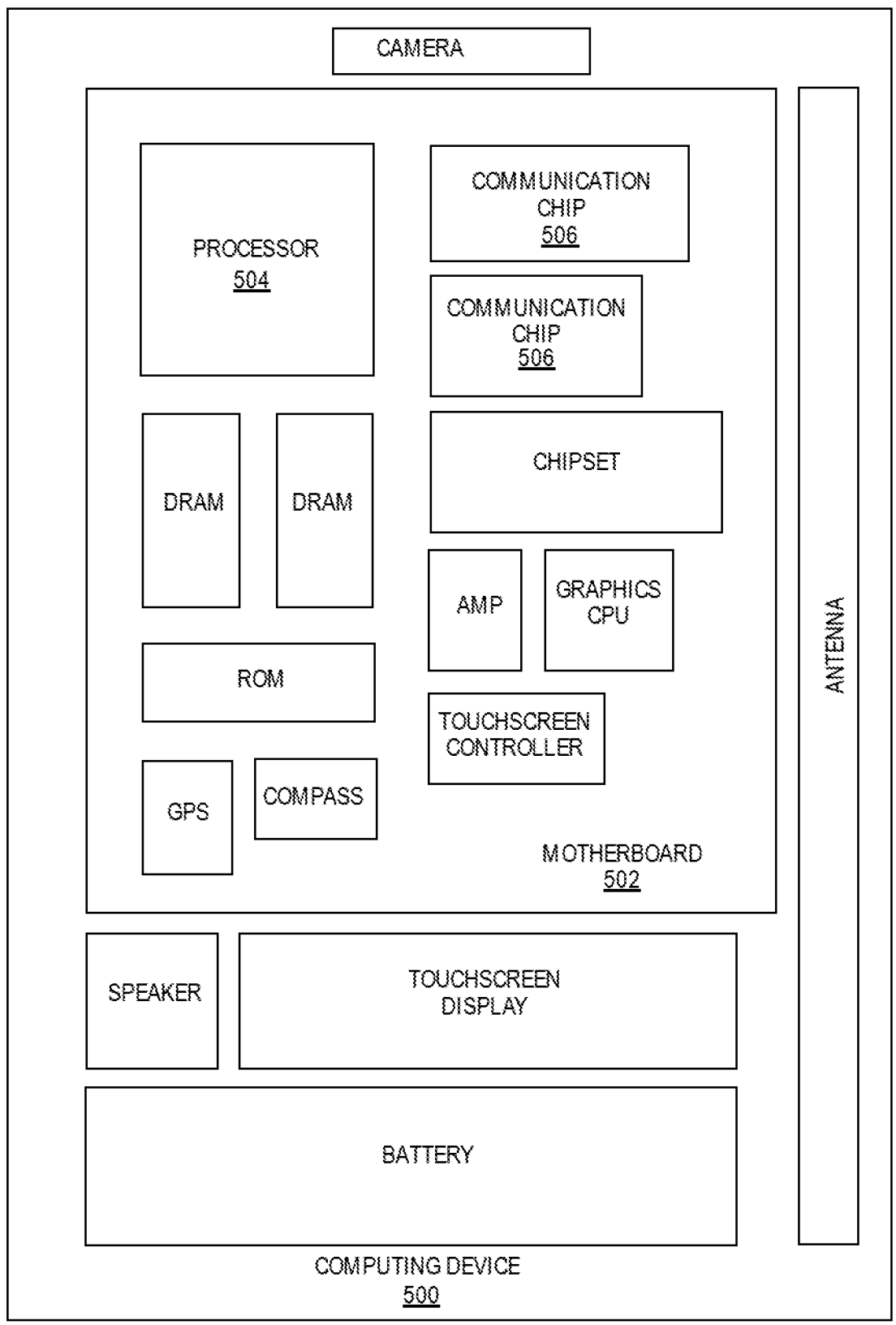
FIG. 5 is a schematic of a computing device built in accordance with an embodiment.

FIG. 5 illustrates a computing device 500 in accordance with one implementation of the invention. The computing device 500 houses a board 502. The board 502 may include a number of components, including but not limited to a processor 504 and at least one communication chip 506. The processor 504 is physically and electrically coupled to the board 502. In some implementations the at least one communication chip 506 is also physically and electrically coupled to the board 502. In further implementations, the communication chip 506 is part of the processor 504.

These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 506 enables wireless communications for the transfer of data to and from the computing device 500. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 506 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 500 may include a plurality of communication chips 506. For instance, a first communication chip 506 may be dedicated to shorter range wireless communications such as Wi-Fi and Bluetooth and a second communication chip 506 may be dedicated to longer range wireless communications such as GPS, EDGE, GPRS, CDMA, WiMAX, LTE, Ev-DO, and others.

The processor 504 of the computing device 500 includes an integrated circuit die packaged within the processor 504. In some implementations of the invention, the integrated circuit die of the processor may be part of an electronic package that comprises a routing patch for routing SERDES signals external to a package substrate, in accordance with embodiments described herein. The term "processor" may refer to any device or portion of a device that processes electronic data from registers and/or memory to transform that electronic data into other electronic data that may be stored in registers and/or memory.

The communication chip 506 also includes an integrated circuit die packaged within the communication chip 506. In accordance with another implementation of the invention, the integrated circuit die of the communication chip may be part of an electronic package that comprises a routing patch for routing SERDES signals external to a package substrate, in accordance with embodiments described herein.

The above description of illustrated implementations of the invention, including what is described in the Abstract, is not intended to be exhaustive or to limit the invention to the precise forms disclosed. While specific implementations of, and examples for, the invention are described herein for illustrative purposes, various equivalent modifications are possible within the scope of the invention, as those skilled in the relevant art will recognize.

These modifications may be made to the invention in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

Example 1: an electronic package, comprising: a package substrate, wherein the package substrate comprises a first routing architecture; a first die on the package substrate; a second die on the package substrate, wherein the first die is electrically coupled to the second die by a bridge embedded in the package substrate; and a routing patch on the package substrate, wherein the routing patch is electrically coupled to the second die, and wherein the routing patch comprises a second routing architecture that is different than the first routing architecture.

Example 2: the electronic package of Example 1, wherein first ends of traces in the routing patch are electrically coupled to the second die, and wherein second ends of the traces in the routing patch are electrically coupled to a second surface of the package substrate that is opposite from a first surface of the package substrate to which the first die, the second die, and the routing patch are attached.

Example 3: the electronic package of Example 2, wherein the second ends of the traces are electrically coupled to the second surface of the package substrate by through substrate vias.

Example 4: the electronic package of Example 1, wherein first ends of traces in the routing patch are electrically coupled to the second die, and wherein second ends of traces in the routing patch are electrically coupled to connectors.

Example 5: the electronic package of Example 4, wherein the connectors are accessed by a cable.

Example 6: the electronic package of Example 4 or Example 5, wherein the connectors are over a top surface of the routing patch.

Example 7: the electronic package of Example 4 or Example 5, wherein the connectors are along a sidewall of the routing patch.

Example 8: the electronic package of Examples 1-7, wherein the first routing architecture comprises a first dielectric thickness between routing layers, and wherein the second routing architecture comprises a second dielectric thickness between metal layers that is greater than the first dielectric thickness.

Example 9: the electronic package of Example 8, wherein the second dielectric thickness is approximately 50 µm or greater.

Example 10: the electronic package of Examples 1-9, wherein the second die is a serializer/deserializer (SERDES) die.

Example 11: the electronic package of Examples 1-10, wherein the package substrate comprises a first dielectric material, and wherein the routing patch comprises a second dielectric material that is different than the first dielectric material.

Example 12: the electronic package of Example 11, wherein a dielectric material in the routing patch comprises a dielectric constant that is less than approximately 4.

Example 13: the electronic package of Examples 1-12, wherein the routing patch is a molded interconnect substrate ball grid array (MISBGA) substrate, a flexible PCB substrate, or an organic interposer substrate.

Example 14: the electronic package of Examples 1-13, wherein the routing patch is entirely within a footprint of the package substrate.

Example 15: the electronic package of Examples 1-13, wherein the routing patch extends beyond a footprint of the package substrate.

Example 16: the electronic package of Example 15, further comprising: a component attached over a portion of the routing patch that extends beyond the footprint of the package, wherein the component is a photonics component.

Example 17: the electronic package of Examples 1-16, further comprising: a plurality of routing patches on the package substrate.

Example 18: a routing patch, comprising: a plurality of dielectric layers; and a plurality of metal layers embedded in the plurality of dielectric layers, wherein the plurality of metal layers include a plurality of interconnect lines having a first end and a second end, wherein a pitch of the plurality of interconnect lines at the first end is less than a pitch of the plurality of interconnect lines at the second end.

Example 19: the routing patch of Example 18, wherein the first end of the plurality of interconnect lines terminate at a first surface of the routing patch proximate to a first edge of the routing patch, and wherein the second end of the plurality of interconnect lines terminate at the first surface of the routing patch proximate to a second edge of the routing patch.

Example 20: the routing patch of Example 18, wherein the second end of the plurality of interconnect lines terminate at connectors.

Example 21: the routing patch of Example 20, wherein the connectors are on a first surface of the routing patch that is opposite from a second surface of the routing patch, wherein the first end of the plurality of interconnect lines terminate at the second surface.

Example 22: the routing patch of Example 20, wherein the connectors are on a sidewall surface of the routing patch.

Example 23: the routing patch of Examples 18-22, wherein the routing patch is a molded interconnect substrate ball grid array (MISBGA) substrate, a flexible PCB substrate, or an organic interposer substrate.

Example 24: an electronic system, comprising: a board; a package substrate attached to the board; a first die on the package substrate; a second die on the package substrate, wherein the first die is electrically coupled to the first die by a bridge in the package substrate; and a routing patch on the package substrate, wherein the second die is electrically coupled to the board by a conductive path that passes through the routing patch.

Example 25: the electronic system of Example 24, wherein the conductive path is external to the package substrate after passing through the routing patch, or wherein the conductive path comprises vertical path through a thickness of the package substrate after passing through the routing patch.

What is claimed is:

1. An electronic package, comprising:
   a package substrate, wherein the package substrate comprises a first routing architecture;
   a first die on the package substrate;
   a second die on the package substrate, wherein the first die is electrically coupled to the second die by a bridge embedded in the package substrate; and
   a routing patch on the package substrate, wherein the routing patch is a discrete component coupled to a same side of the package substrate as the second die and is laterally spaced apart from the second die, wherein the routing patch is electrically coupled to the second die by a trace in the package substrate, and wherein the routing patch comprises a second routing architecture that is different than the first routing architecture.

2. The electronic package of claim 1, wherein first ends of traces in the routing patch are electrically coupled to the second die, and wherein second ends of the traces in the routing patch are electrically coupled to a second surface of the package substrate that is opposite from a first surface of the package substrate to which the first die, the second die, and the routing patch are attached.

3. The electronic package of claim 2, wherein the second ends of the traces are electrically coupled to the second surface of the package substrate by through substrate vias.

4. The electronic package of claim 1, wherein first ends of traces in the routing patch are electrically coupled to the second die, and wherein second ends of traces in the routing patch are electrically coupled to connectors.

5. The electronic package of claim 4, wherein the connectors are accessed by a cable.

6. The electronic package of claim 4, wherein the connectors are over a top surface of the routing patch.

7. The electronic package of claim 4, wherein the connectors are along a sidewall of the routing patch.

8. The electronic package of claim 1, wherein the first routing architecture comprises a first dielectric thickness between routing layers, and wherein the second routing architecture comprises a second dielectric thickness between metal layers that is greater than the first dielectric thickness.

9. The electronic package of claim 8, wherein the second dielectric thickness is approximately 50 µm or greater.

10. The electronic package of claim 1, wherein the second die is a serializer/deserializer (SERDES) die.

11. The electronic package of claim 1, wherein the package substrate comprises a first dielectric material, and wherein the routing patch comprises a second dielectric material that is different than the first dielectric material.

12. The electronic package of claim 11, wherein a dielectric material in the routing patch comprises a dielectric constant that is less than approximately 4.

13. The electronic package of claim 1, wherein the routing patch is a molded interconnect substrate ball grid array (MISBGA) substrate, a flexible PCB substrate, or an organic interposer substrate.

14. The electronic package of claim 1, wherein the routing patch is entirely within a footprint of the package substrate.

15. The electronic package of claim 1, wherein the routing patch extends beyond a footprint of the package substrate.

16. The electronic package of claim 15, further comprising:
   a component attached over a portion of the routing patch that extends beyond the footprint of the package, wherein the component is a photonics component.

17. The electronic package of claim 1, further comprising: a plurality of routing patches on the package substrate.

* * * * *